(12) United States Patent
Stambaugh et al.

(10) Patent No.: US 6,631,488 B1
(45) Date of Patent: Oct. 7, 2003

(54) CONFIGURABLE ERROR DETECTION AND CORRECTION ENGINE THAT HAS A SPECIALIZED INSTRUCTION SET TAILORED FOR ERROR DETECTION AND CORRECTION TASKS

(75) Inventors: Mark A Stambaugh, Liberty Lake, WA (US); Kevin Seacrist, Verdale, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 557 days.

(21) Appl. No.: 09/607,677

(22) Filed: Jun. 30, 2000

(51) Int. Cl.[7] ................ G06F 11/00; H03M 13/00; H03M 13/03
(52) U.S. Cl. ............... 714/746; 714/715; 714/758; 714/786; 714/788
(58) Field of Search .................. 714/746, 758, 714/715, 755, 756, 757, 786, 787, 788

(56) References Cited

U.S. PATENT DOCUMENTS 5,361,249 A  * 11/1994 Monastra et al. ........... 370/217
6,128,755 A  * 10/2000 Bello et al. ................. 714/715

* cited by examiner

*Primary Examiner*—Emmanuel L. Moise

(57) ABSTRACT

An apparatus and method for efficiently performing error control coding tasks. An important aspect of the present invention is the provision of an ECC engine that responds to a specialized ECC instruction set having a plurality of instructions, such as a convolutional encoding instruction, a convolutional decoding instruction, and a cyclic redundancy code (CRC) instruction. The ECC engine has a plurality of functional building blocks (e.g., a configurable convolutional encoding functional block, a convolutional configurable decoding functional block, and a configurable cyclic redundancy check (CRC) functional block) that can be programmed or configured. A single instruction provided to the error control coding engine configures one of the functional blocks to execute a error control coding algorithm specified by the instruction. Each instruction also includes a plurality of fields that can be modified by the user. Each modified instruction dynamically re-configures one of the functional building blocks to implement a different ECC algorithm.

20 Claims, 6 Drawing Sheets

CONFIGURABLE ERROR DETECTION AND CORRECTION ENGINE THAT HAS A SPECIALIZED INSTRUCTION SET TAILORED FOR ERROR DETECTION AND CORRECTION TASKS

FIELD OF THE INVENTION

The present invention relates generally to error control coding, and more specifically, to a configurable error control coding (ECC) engine that has a specialized instruction set tailored for ECC tasks.

BACKGROUND OF THE INVENTION

General Error Correction

In digital electronic systems, information is represented in a binary format (i.e., as a series of 0's and 1's). When information in a binary format is transported from a first point to a second point or stored on a magnetic media, there is the possibility of an error occurring during the transmission and reception process. For example, a "1" can be interpreted as a "0", or a "0" can be interpreted as a "1". There may be any number of reasons for the error. For example, media defects, electronic noise, component failures, poor connections, deterioration of data due to age, multi-path fading, other factors, or a combination thereof, can cause these errors. When a bit of information is mistakenly interpreted, a bit error has occurred.

To address the problem of bit errors, error correction schemes have been developed. Error correction is simply the use of techniques to detect bit errors and to correct them. Information can be conveyed as a group of bits. Typically, error correction schemes add "redundant" bits (i.e., extra bits) to the information. The extra bits add a particular structure to the information. Consequently, if the structure is altered by errors, the changes can be detected and corrected.

Some have used the following analogy to the English language to describe error correction schemes. The English language is based on the English alphabet and words that are formed by utilizing the letters in that alphabet. It is obvious that not all possible combinations of the English alphabet form "meaningful words" where "meaningful words" are defined as those words listed in a dictionary of the English language. Errors that occur when transmitting or storing English words can be detected by determining if the received word is defined by the dictionary. If the received word does not correspond with any word in the dictionary, errors in the word may be corrected by finding a meaningful word that is closest to the received word. Conceptually, error correction systems perform in a similar fashion to this analogy described above.

Error Correction for Wireless Systems

We live in a communication intensive society where the accurate transfer of information is important. Data communication via a wired system using cables or telephone lines is generally more reliable in the sense that there are fewer transmission errors than in a wireless communication system. One common example of wireless communications is the use of cellular telephones for voice communication, and increasingly, for data transfer.

In general, when designing a wireless system, the transmission errors in the communication channel need to be addressed. One situation that creates transmission errors in a wireless system is the existence of noise that can be man-made (e.g., radio frequency (RF) sources, electromagnetic field generated by electric sources, etc.), that can result from natural phenomenon (e.g., lightening, atmospheric conditions, etc.) or that can stem from the intrinsic thermal noise of the receiver. The noise can corrupt data that is being transferred. For example, in the cell phone example, the noise can manifest itself as static or as a loss of the voice data. The loss of voice data can be the loss of a spoken word, phrase, or entire sentence. If the noise is severe, the connection between the cellular telephone and the base station can be terminated. Accordingly, one goal of wireless system design is to provide a mechanism for addressing the transmission errors in the channel.

A second problem associated with a wireless system is that the communication channel is lossy (i.e., a signal may be at a high amplitude at the transmitting antenna, but of low amplitude a few miles away). Since the rate of transmission errors (i.e., the error rate) decreases with a higher signal-to-noise ratio, the error rate can be decreased by increasing the power transmitted by the cellular telephone, for example. Unfortunately, using higher power for transmission decreases the battery life of the cellular telephone that inconveniences users of such phones. Accordingly, it is desirable for a mechanism to correct transmission errors.

In this regard, in order too address the lossy and noisy traits of a wireless communication channel, designers commonly employ error correction systems. Error correction systems add additional bits to the data transmission, which are referred to as error correction bits, to detect and correct bit errors. There are many different types of error correction algorithms that can be effectively employed to detect and correct for bit errors in wireless systems, thereby increasing the accuracy of data communications and decreasing the number of errors encountered.

One approach to implementing the error correction algorithms is to utilize processors with a general arithmetic logic unit (ALU) or general floating point unit (FPU). Unfortunately, this approach does not provide (1) adequate performance and (2) the appropriate level of abstraction for error correction and detection tasks.

First, these general ALUs or FPUs provide only tolerable performance for error control coding (ECC) since the general processor must be able to perform many different tasks, only one of which is error correction related tasks. Consequently, the general ALU or FPU is not optimized for ECC tasks.

Second, a programmer who is writing code to implement a particular error detection and correction algorithm is required to program at an inappropriate level of abstraction. For example, the programmer is forced to write many lines of code in a development language, such as "C" programming language, just to implement a single error detection or error correction task. in a typical error detection and correction system, there is an encoder block and a decoder block with several functional blocks within each. The encoder block, for example, may include a convolutional encoder and interleaver that each would require one or more pages of program code in "C" to implement. Similarly, the decoder block, which may include a convolutional decoder and a de-interleaver, each would require one or more pages of code to implement. When the number of lines of required code increases, the development costs of a project generally increases proportionally. Furthermore, more lines of code leads to longer time to debug and to verify the proper operation of the code.

Consequently, it would be desirable for there to be an engine that can easily and simply implement a particular error correction task (e.g., convolutional encoder) without many lines of code. By simplifying and reducing the number of instructions that a developer has to write to implement an error detection or correction task, the attendant complexities and difficulties in developing code at an unnecessarily low level of abstraction can be decreased.

Programming at an unnecessarily low level of abstraction also adversely affects performance. For example, a single error control coding algorithm often involves many lines of instructions in a loop, where each execution of the loop requires multiple clock cycles to generate a single bit of output. In this regard, it is desirable for a mechanism for allowing a designer to specify an algorithm with a single instruction and for reducing the number of clock cycles needed to generate the output bits of error control coding algorithms.

Another approach to implementing the error correction and detection algorithms is to utilize specialized application specific integrated circuits (ASICs) that are hard-wired to perform a particular error-coding algorithm. This approach offers very fast execution and improves the performance when compared with the first approach. Unfortunately, new wireless communication protocols that specify different error correction algorithms are always being developed. In addition, current protocols are subject to numerous revisions and changes that also affect the type of error detection and correction algorithms used.

In this regard, the ASICs are inflexible in that when a new error coding algorithm is needed or a new standard (e.g., a wireless standard) is required, an entirely new ASIC that is hard-wired for the new algorithm or standard needs to be developed. As can be appreciated, the inflexibility of this approach and inability to adapt to new standards undesirably increases product development costs and time. Consequently, a mechanism is needed to allow a computation unit to be flexible enough to adapt to these new algorithms without the costs and development time required by the second prior art approach.

Based on the foregoing, it is clearly desirable to provide an apparatus and method for efficiently performing error detection and correction tasks, that provides an appropriate level abstraction for error correction methods, and that is flexible to adapt to changes in error coding algorithms.

SUMMARY OF THE INVENTION

An apparatus and method for efficiently performing error control coding (ECC), such as error detection and correction (EDAC) tasks, are provided. An important aspect of the present invention is the provision of an error control coding (ECC) engine that responds to a specialized ECC instruction set having a plurality of instructions. Examples of these instructions include a convolutional encoding instruction, a convolutional decoding instruction, an interleave instruction, a bit manipulation instruction, and a cyclic redundancy code (CRC) instruction. The ECC engine has a plurality of functional building blocks (e.g., a configurable convolutional encoding functional block, a configurable convolutional decoding functional block, and a configurable cyclic redundancy code (CRC) check functional block) that can be programmed or configured. A single instruction provided to the error control coding engine configures one of the functional blocks to execute an error control coding algorithm specified by the instruction. Each instruction also includes a plurality of fields that can be set by the user to specify parameters of the ECC algorithm. Each modified instruction dynamically re-configures one of the functional building blocks to implement a different ECC algorithm specified in by the instruction.

Preferably, each ECC task can be described as a single command or instruction for the ease of programming. Instead of having to program many lines of code to implement an ECC task, by using the programmable ECC engine of the present invention, the programmer can specify a desired ECC task with a single instruction. The instruction set of the ECC engine of the present invention is tailored at the optimal level of programming abstraction for ECC task, thereby greatly simplifying the design, programming, and implementation of these ECC tasks.

In the presently preferred embodiment, the configurable ECC engine of the present invention is incorporated with a processor. The processor includes an arithmetic logic unit (ALU) for executing non-error detection and correction tasks and the ECC engine of the present invention for executing ECC tasks in response to special ECC instructions. The special instruction set is incorporated into the general instruction set utilized by the processor. An instruction decoder that is coupled to the general purpose ALU and the ECC engine is provided. The instruction decoder decodes and routes instructions to an appropriate processing unit (e.g., the instruction decoder can route non-ECC instructions to the general purpose ALU for execution and route ECC instructions to the ECC engine for execution.

In an alternative embodiment, the system includes a processor having a general purpose ALU for executing non-ECC tasks and a co-processor having the configurable ECC engine of the present invention for executing ECC tasks. In this embodiment, a shared memory is provided. The processor and the co-processor can utilize the shared memory to communicate information (e.g., a specialized error correction code instruction) therebetween. An advantage of this embodiment is that after passing control to the co-processor of an ECC task, the processor is free to execute other non-ECC tasks while waiting for the co-processor to return results.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE PREFERRED EMBODIMENT

A method and apparatus for efficiently performing error detection and correction tasks are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

It is noted that the present invention is described in connection with an error control coding engine (ECC) that performs error control coding(ECC) tasks and different architectures in which the ECC engine can be implemented. The term "error control coding" includes error detection without correction and also error detection and correction. One embodiment of the present invention implements ECC algorithms that both detect and correct errors in the transmitted/received data. Accordingly, in most instances the ECC engine of the present invention is described as performing error detection and correction (EDAC) tasks. However, it should be appreciated that such EDAC tasks also include error detection only tasks (i.e., tasks without error correction) that may be suited for certain applications.

Exemplary Error Control Coding System 100

Figure 1:
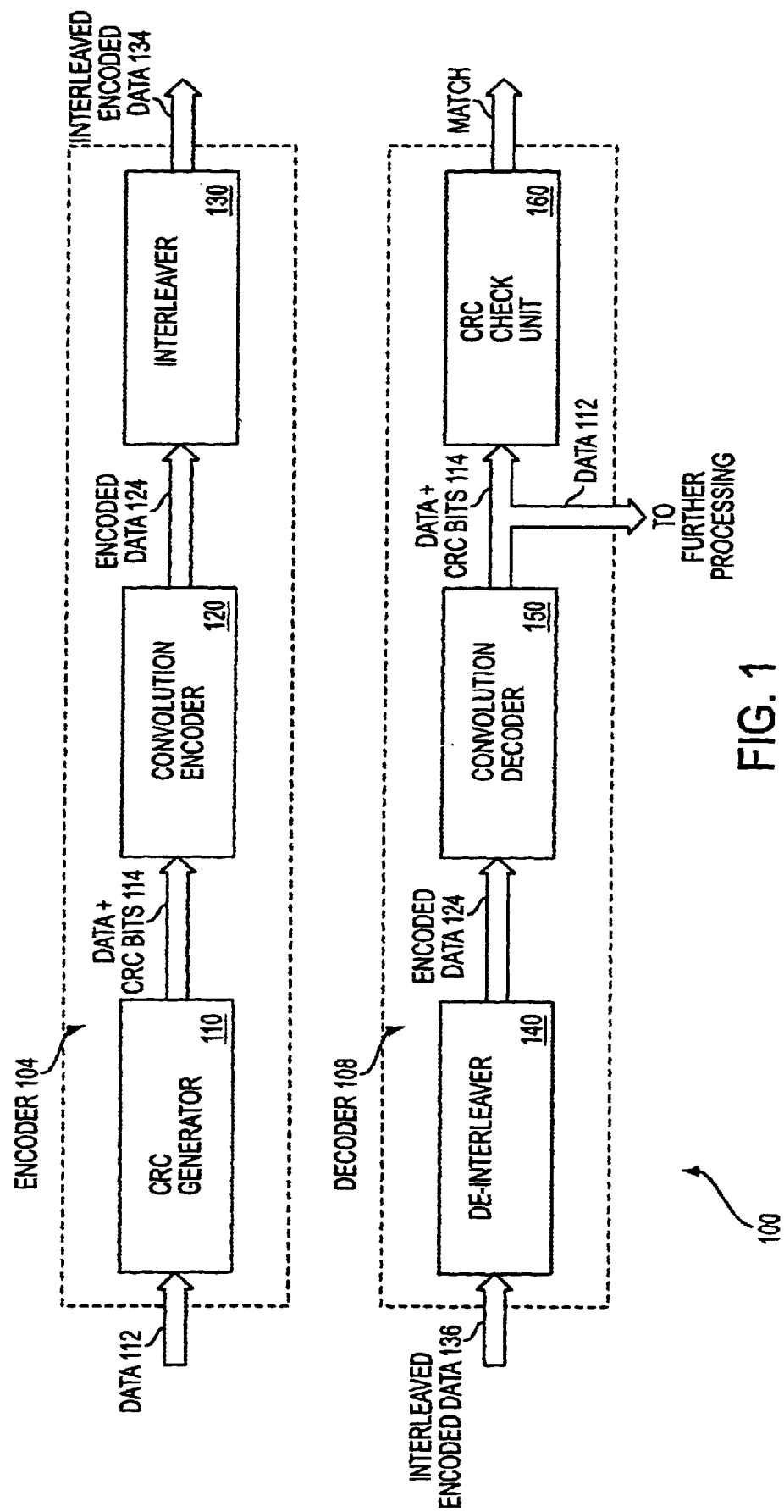
FIG. 1 is a block diagram of an error detection and correction system, which can be implemented by utilizing the ECC engine of the present invention.

FIG. 1 is a block diagram of an error detection and correction system 100, which can be implemented by utilizing the error control coding (ECC) engine of the present invention. The system 100 includes an encoder 104 for receiving data 112 (e.g., voice data) and generating interleaved encoded data 134 (e.g., voice encoded data that may be transmitted via RF) and a decoder 108 for receiving interleaved encoded data 136 (e.g., data provided by a receiver) and recovering the data 112.

The encoder 104 includes a CRC generator 110, a convolutional encoder 120, and an interleaver 130. The CRC generator 110 receives data 112 and based thereon generates data 1 14 with CRC bits added thereto. The convolutional encoder 120 is coupled to the CRC generator for receiving the data 114 with the CRC bits and based thereon generates encoded data 124. The interleaver 130 is coupled to the convolutional encoder 120 for receiving the encoded data 124 and based thereon generates interleaved encoded data 134. It is noted that depending on the specific application, the encoder 104 can include other functional blocks not shown in FIG. 1 or have a configuration different from that shown in FIG. 1.

The decoder 108 includes a de-interleaver 140, a convolutional decoder 150, and a CRC check unit 160. The de-interleaver 140 receives interleaved encoded data 134 and based thereon generates encoded data 124. The convolutional decoder 150 is coupled to the de-interleaver 140 for receiving the encoded data 124 and based thereon recovers the data 114 with the CRC bits. The CRC check unit 160 independently calculates the CRC bits based on the received data and compares these calculated bits to the CRC bits received in the transmission. If there is a match, the received data 112 does not contain errors. Otherwise, there are errors in the data, and the receiver needs to request re-transmission of that information. The data 112 can then be provided to other modules for further processing. It is noted that depending on the specific application, the decoder 108 can include other functional blocks not shown in FIG. 1 or have a configuration different from that shown. Often, the functional blocks of the encoder 108 mirror or perform the inverse function of the corresponding functional blocks in the encoder 104.

ECC Architecture having both a Processor and a Co-processor

Figure 2:
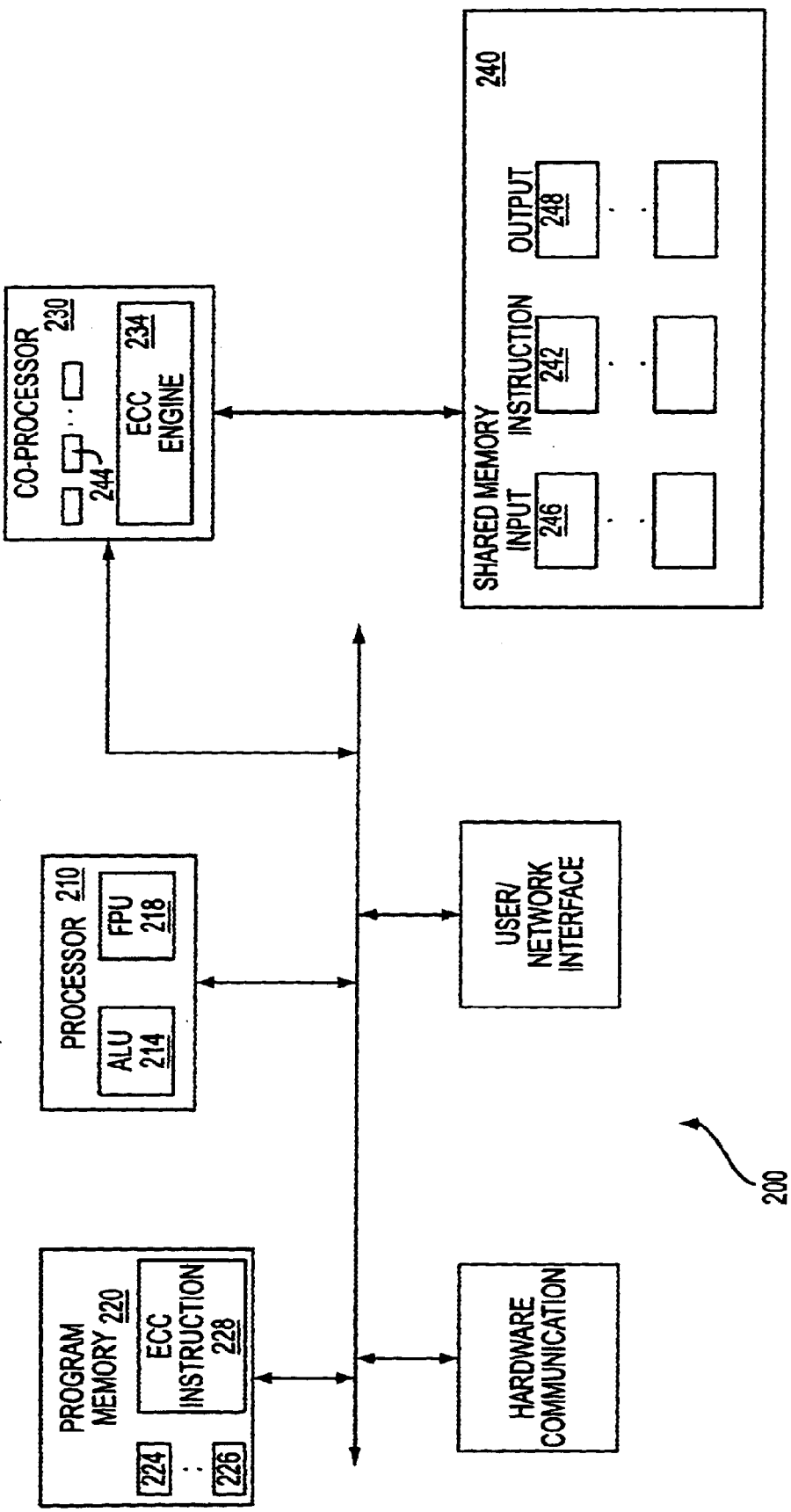
FIG. 2 is a block diagram of a second embodiment of a system with a processor and a co-processor in which the error detection and correction engine of the present invention can be implemented.

FIG. 2 is a block diagram of a first embodiment of a system 200 with a processor 210 and a co-processor 230 in which the error detection and correction engine 234 of the present invention can be implemented. The system 200 includes a processor 210 for handling tasks other than error control coding (ECC) tasks. In wireless communication applications, these tasks can include user interface functions (e.g., responding to requests for receiving a call, placing a call, retrieving messages, etc.), hardware control functions (e.g., controlling the RF hardware and instruments for transmission and reception of call information), base station-to-mobile unit communication functions (e.g., performing a hand-over of a call from a first coverage area to a second coverage area). The processor 210 includes a general purpose arithmetic logic unit (ALU) 214 and a general purpose floating point unit (FPU) 218.

The processor 210 is coupled to a program memory 220 (e.g., a read only memory (ROM)) that can include one or more programs (e.g., programs 224 and 226) for instructing the processor 204 to perform the non-ECC related tasks. In accordance with this embodiment of the present invention, an ECC program 228 also resides in the program memory 220. When a particular ECC task is requested, an instruction or plurality of instructions (e.g., a program) associated with the requested task is then written to a shared memory 240 so that the program is accessible to the co-processor 230 and in particular to the ECC 234 of the present invention. This process of transferring ECC tasks from the processor 210 to the co-processor 230 and more specifically to the ECC engine 234 and the process of communicating data therebetween are explained in greater detail hereinafter with reference to FIG. 3.

The co-processor 230 is provided to perform error control coding (ECC) tasks, thereby "un-loading" or relieving the processor 210 from these tasks. The co-processor 230 is equipped with the error control coding (ECC) engine 234 of the present invention. The ECC engine 234 performs error control coding (ECC) tasks. The ECC engine 234 can be utilized to detect errors in received data or stored data and correct these errors. The ECC engine 234 executes a specialized ECC instruction set. In other words, the ECC engine 234 can be configured or programmed to perform different ECC tasks by specifying different ECC commands or instructions. For example, these instructions can include, but are not limited to, those commands and associated opcodes listed in TABLE I. The ECC engine 234 is described in greater detail hereinafter with reference to FIGS. 5–7.

TABLE I

| COMMAND | OPCODE |
| --- | --- |
| Convolutional Encode | 0001 |
| Viterbi Decode | 0002 |
| Interleave | 0004 |
| Bit Manipulation | 0008 |
| CRC | 0010 |
| Boolean Operation | 0020 |
| Jump | 1000 |
| IF | 2000 |
| Noop | 8000 |

Preferably, a shared memory 240 is coupled only to the co-processor 230, and access to the shared memory 240 by the processor 210 is through the co-processor 230. This arrangement is preferred so that the interface provided by the co-processor 230 can be a slave interface which is more generic, and consequently, the interface is not limited to a specific bus protocol. The shared memory 240 may be utilized by the processor 210 and the co-processor for communicating data therebetween.

The co-processor 230 includes a plurality of control registers (e.g., control register 244). The control register holds a location (e.g., an address) in memory 240 where an instruction begins. Each control register is associated with a particular priority level. For example, level 0 can represents the highest priority and level N can represent the lowest priority.

The shared memory 240 includes an instruction area 242, an input area (e.g., area 246), and an output area (e.g., area 248) associated with each control register. The instruction area can be utilized by the processor 210 to write ECC instructions (e.g., a sequence of instructions or "instruction sequence"), the input area can be utilized by the processor 210 to write input data, and the output area can be utilized by the co-processor 230 to write the output data corresponding to a particular instruction sequence. The instruction area, input area, and output area can be specified by a predetermined memory address or location.

The processor 210 writes an ECC instruction sequence (e.g., an ECC program) to the instruction area 242 and also writes the input data related to the instruction sequence to the input area 246. Thereafter, the processor 210 selects a control register that corresponds to a priority that meets the application's requirement and loads the register with a location of the first ECC instruction in the sequence.

Figure 3:
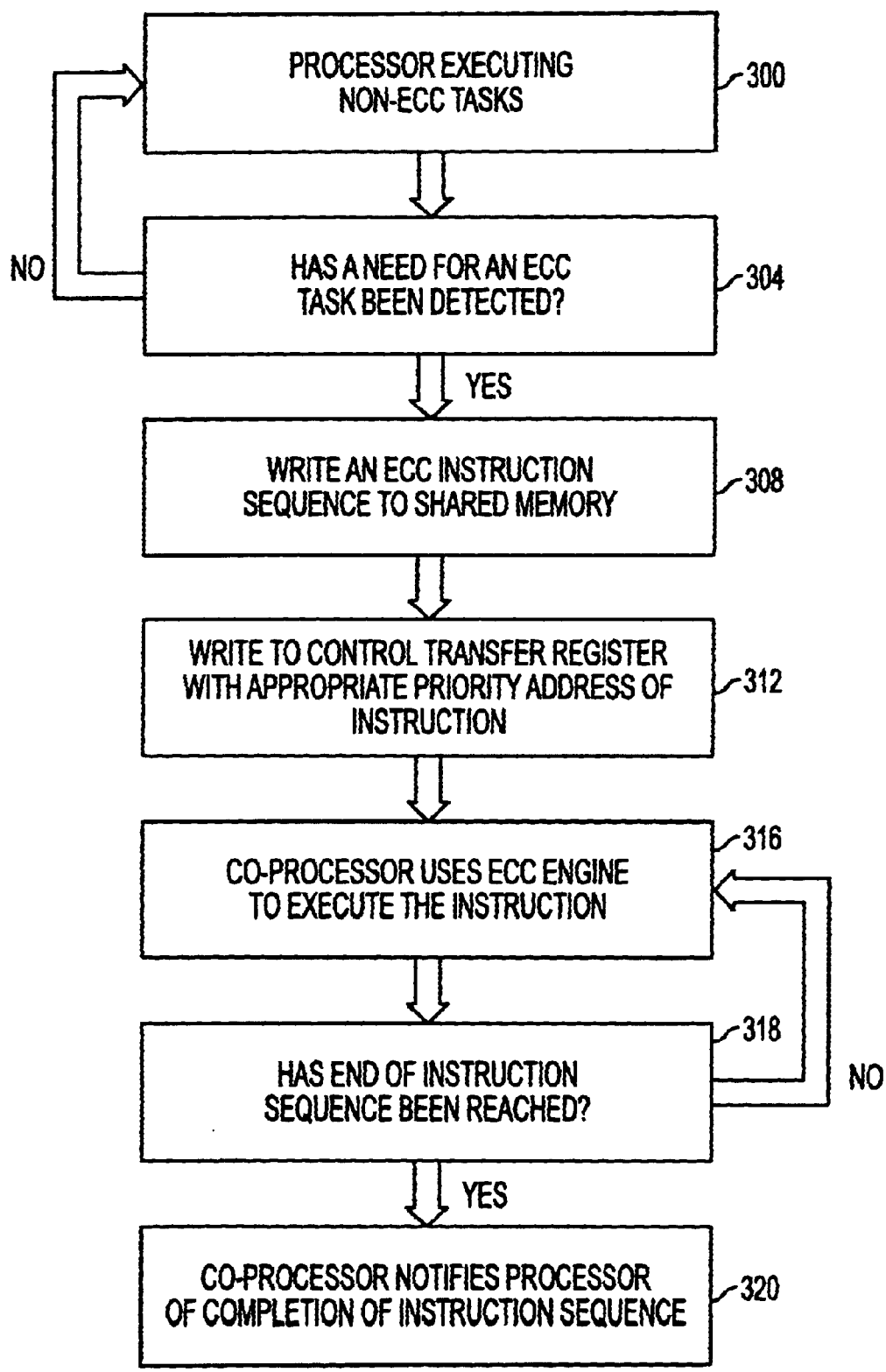
FIG. 3 is a flow chart illustrating the steps performed by components of the system of FIG. 2.

FIG. 3 is a flow chart illustrating the steps performed by components of the system of FIG. 2. In step 300, the processor 210 executes non-ECC tasks. In step 304, a determination is made whether a need for an ECC task has been detected. For example, a program that is processing a particular wireless communication protocol can determine that channel coding (e.g., layer1 coding of the Open Systems Interconnection (OSI) model) is needed at a particular point in the program. If no, the processor 210 continues to execute its non-ECC tasks. If yes, in step 308 the processor 210 writes an ECC instruction sequence to the shared memory 240. In step 312, write the location of the first ECC instruction to one of the control transfer registers with a priority that meets an application's requirements. It is noted that once control of an ECC program thread or process is passed from the microprocessor to the co-processor, the microprocessor can then execute other tasks while the co-processor is executing the ECC task.

In step 316, the co-processor uses the ECC engine 234 to execute the ECC instruction by reading the instruction from the instruction area 242 in the memory 240, reading the input data from the input area 246 in memory 240, and writing the resulting data to the output area 248 in the memory 240. As noted previously, the instruction area, input area, and the output area can be specified in the ECC instruction. In step 318, it is determined whether the end of the instruction sequence has been reached. If yes, processing continues to step 320, the co-processor 230 notifies the processor 210 of completion of the ECC task by utilizing an interrupt for example. Otherwise, the processing continues at step 316 to execute the next instruction.

One novel aspect of the present invention is the use of multi-tasking or time sharing on the co-processor 230. In prior art systems, the co-processor typically performs a single task delegated to it by the processor. In contrast, the architecture of the present invention includes a plurality of control registers, where each control register is associated with a priority level, and where the processor 210 can assign a plurality of tasks at different priorities to the co-processor by utilizing these control registers. These tasks can be a single ECC instruction or an ECC program having a plurality of ECC instructions.

In prior art approaches, a single processor is utilized to process all tasks including ECC tasks without the aid of a co-processor. Since the ECC algorithms are processor intensive and typically consume 10 to 100 millions of instructions per second (MIPs), there is a severe burden placed on the processor of such a system. Consequently, the preferred embodiment of the present invention features an ECC architecture that includes a co-processor 230 in addition to the processor 210.

It is noted that this embodiment incurs the cost of performing a context switch between processor and co-processor in order to un-load the ECC tasks from the processor so that the processor can manage and perform other non-ECC tasks or initialize other ECC tasks. As will be explained hereinafter, the ECC engine 234 includes bit manipulation, jump, and condition (e.g., IF) operations that can reduce the number of context switches needed.

ECC Architecture having a Single Processor

Figure 4:
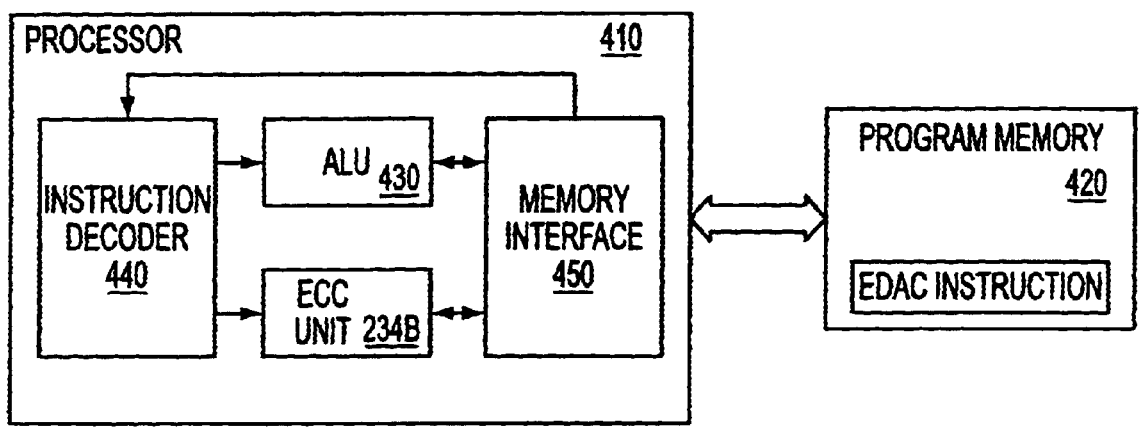
FIG. 4 is a block diagram of a first embodiment of a system with a single processor in which the error detection and correction engine of the present invention can be implemented.

FIG. 4 is a block diagram of a second embodiment of a system 400 with a single processor 410 in which the error control coding (ECC) engine 234B of the present invention can be implemented. In this embodiment, it is noted that the costly context switch is no longer needed. The specialized instruction set of the present invention can be incorporated into the instruction set of the general purpose CPU. Accordingly, during program execution, if an ECC task or operation is detected, the instruction decoder simply provides the ECC instruction to the ECC engine 234B of the present invention for execution. Otherwise, the instruction decoder provides the instruction to the general arithmetic logic unit (ALU) 430.

Instruction Fields

As described previously, the ECC engine 234 or 234B is responsive to ECC instructions defined by a special ECC instruction set. Each instruction can include a plurality of fields that specify parameters of the ECC task or operation. The present invention utilizes a first field to specify a location to read input data, a second field to specify a location to write output data, and a third field, which may be a set of fields, for specifying configuration information related to a particular ECC algorithm.

Convolutional Encoder Command

For example, the configuration information fields can include a first configuration field for specifying the number of bits (input or output bits) that the algorithm operates on and a second configuration field for specifying the specific coefficients of the polynomials to be utilized in the convolutional encoder algorithm. It is noted that the number of polynomials typically corresponds to the number of output bits (n) generated for every (k) input bits as can be specified in other fields.

For example, the convolutional encoder command can have the fields as set forth in TABLE II. The FROM POINTER field specifies the location from which to read data that is supplied as an input to the encoding algorithm. The TO POINTER field specifies the location to write output data of the encoding algorithm.

The FROM OFFSET field specifies a bit offset that is used to determine the first bit in a bit array that is to be used as input to the encoding algorithm. Similarly, the TO OFFSET field specifies a bit offset that is used to determine the first bit location to store output data in an output array.

The polynomial fields (POLYNOMIAL_1 to POLYNOMIAL_N) are utilized to specify the coefficients of a respective polynomial. In the preferred embodiment, N is equal to eight, which flexibly allows the user to specify up to eight polynomials for use in connection with different encoding algorithms.

The K & N fields specify the k and n parameters described above, respectively, and the TOTAL OUTPUT BITS field specifies the total number of output bits for the encoding algorithm.

It is noted that the number of actual fields can vary and that other additional fields not described in TABLE II or fewer fields can be utilized in the encoding instruction in order to suit a particular application.

TABLE II

| CONVOLUTIONAL ENCODE COMMAND | |
| --- | --- |
| K | N |
| FROM POINTER | |
| TO POINTER | |
| FROM OFFSET | |
| TO OFFSET | |
| POLYNOMIAL_1 | |
| . | |
| . | |
| POLYNOMIAL_N | |
| TOTAL OUTPUT BITS | |

CRC Command

The CRC command has a first field for specifying the location (e.g., address) to read the input data, a second field for specifying the location to write the output data, and a third configuration field (or a set of fields) for specifying the (1) length of the CRC bits and the (2) coefficients of a polynomial to be utilized.

For example, the CRC command can have the fields as set forth in TABLE III. The FROM POINTER field specifies the location from which to read data that is supplied as an input to the CRC algorithm. The TO POINTER field specifies the location to write output data of the CRC algorithm.

The FROM OFFSET field specifies a bit offset that is used to determine the first bit in a bit array that is to be used as input to the CRC algorithm. Similarly, the TO OFFSET field specifies a bit offset that is used to determine the first bit location to store output data in an output array.

The POLYNOMIAL field is utilized to specify the coefficients of the polynomial. The polynomial field can have a predetermined or fixed number of bits. However, it is noted that shorter polynomials can be used by filling or padding the un-used bits with zeros.

The LENGTH field specifies the length of the CRC bits. The length of the CRC bits corresponds to the length of the POLYNOMIAL field. The TOTAL INPUT BITS field specifies the number of input bits on which the CRC algorithm operates.

It is noted that the number of actual fields can vary and that other additional fields not described in TABLE III or fewer fields can be utilized in the encoding instruction in order to suit a particular application.

TABLE III

| CRC COMMAND |
| --- |
| FROM POINTER |
| TO POINTER |
| FROM OFFSET |
| TO OFFSET |
| POLYNOMIAL |
| TOTAL INPUT BITS |
| LENGTH |

Interleave Command

The interleave command simply specifies a mapping from a first array that includes the data to be interleaved to a second array the interleaved data. The FROM MAP TABLE POINTER field specifies the location of a table that contains the bit offsets into an input array defined by the FROM POINTER and the FROM OFFSET fields. Similarly, the TO MAP TABLE POINTER field specifies the location of a table that contains the bit offsets into an output array defined by the TO POINTER and the TO OFFSET fields.

The interleave algorithm uses the specified offsets (FROM and TO) and copies the data in the first array into the second array.

It is noted that the interleave performance can be increased if at least one of the map tables (FROM or TO) is sequential. For example, if the order that data is written into the output array is sequential, then there is no need for a TO MAP table or if the order that data is read from the input array is sequential, then there is no need for a FROM MAP table. The read and write indices can be implemented with a (1) table of values, (2) a sequential set of values generated by a counter, or (3) can be calculated based on a formula. In one embodiment, the read index is implemented by a table, and the output data is written sequentially into the output array.

TABLE IV

| INTERLEAVE COMMAND |
| --- |
| FROM POINTER |
| TO POINTER |
| FROM OFFSET |
| TO OFFSET |
| FROM MAP TABLE POINTER |
| TO MAP TABLE POINTER |
| BITS TO LEAVE |

Bit Manipulation

This command is provided to selectively move a consecutive block of data from a first frame (e.g., a time slot) to a second frame in the processing of data.

Most fields in this instruction, such as the FROM POINTER, TO POINTER, FROM OFFSET, TO OFFSET fields are similar to those described previously for the other instructions and their description will not be repeated herein. The bit manipulation instruction does contain a TOTAL BITS TO MOVE field that specifies the number of bits in a block to be moved. An optional PAD DATA field can also be included in this instruction for forcing the command block to an even 32 bit boundary that is especially useful for programming 32-bit processors.

A first example of how a bit manipulation operation is useful is moving CRC bits into an appropriate output frame.

The bit manipulation operation is also useful in inserting a synchronization field into a block of data.

TABLE V

BIT MANIPULATION COMMAND

FROM POINTER
TO POINTER
FROM OFFSET
TO OFFSET
TOTAL BITS TO MOVE

The provision of this command by the present invention allows the embodiment having the co-processor to reduce the number of context switches that were typically needed in order to have the general purpose processor process packets (e.g., moving blocks in the packet).

The other commands listed in TABLE I, such as no operation (noop) instruction, Boolean instructions (logical AND, logical OR, etc.), IF instruction, and jump instruction, and how these commands may be implemented in hardware, are well-known by those of ordinary skill in the art and are not discussed herein.

ECC Engine 234

Figure 5:
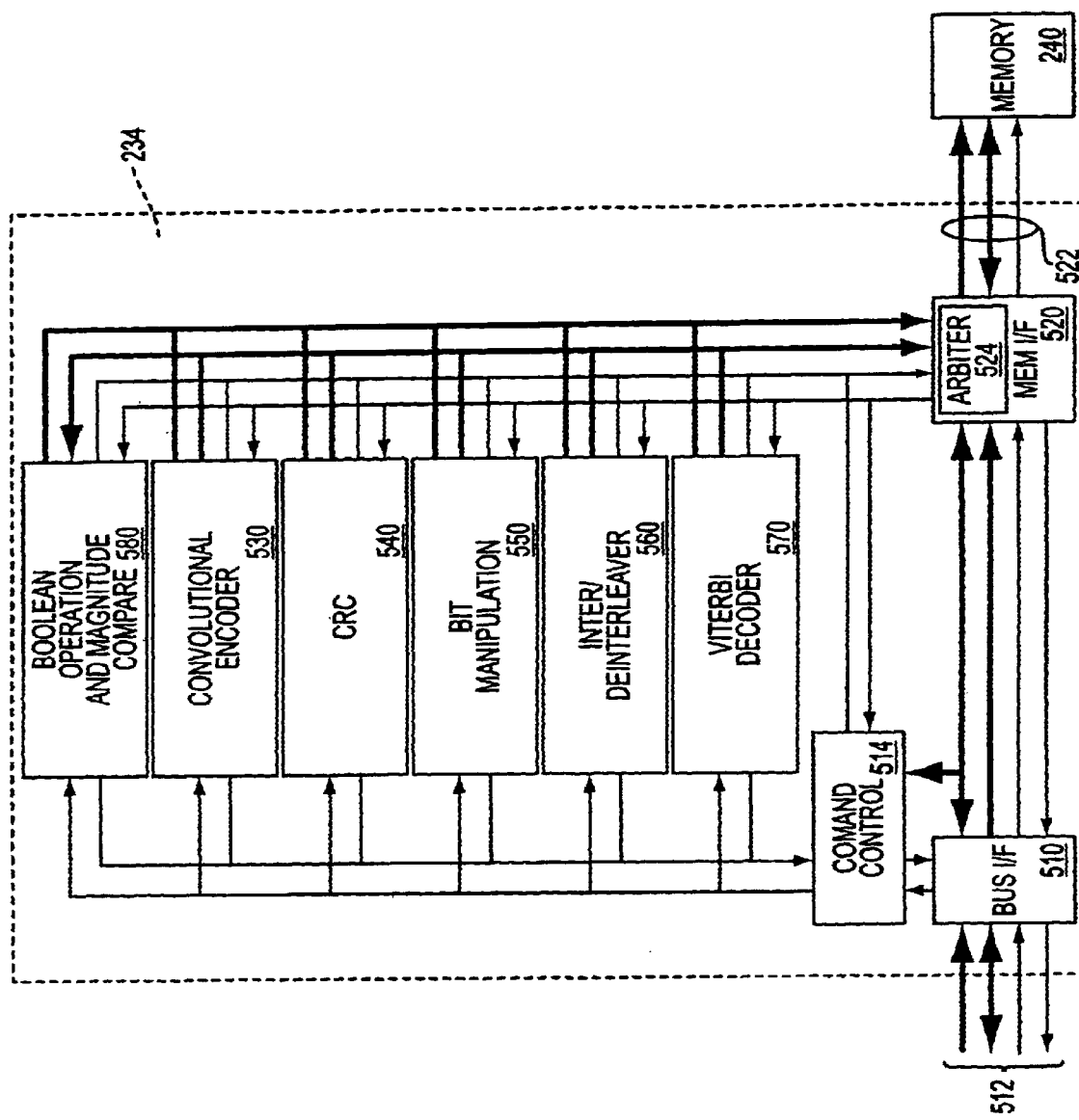
FIG. 5 is a block diagram illustrating in greater detail the error detection and correction engine of FIGS. 1 and 2.

Referring to FIG. 5, the ECC engine 234 of the present invention will now be described in greater detail in the context of the co-processor embodiment. The ECC engine 234 includes a plurality of functional blocks (530 to 580) where each functional block can be configured to perform a specific ECC algorithm. However, unlike the dedicated hardware of the prior art, which is hard-wired to implement a single specific algorithm, the present invention provides a flexible ECC instruction set that can be utilized to selectively configure the functional blocks (e.g., blocks 530 to 580) with parameters, such as the coefficients of the polynomial, the rate, etc. in order to implement different ECC algorithms and to adapt to changing algorithms.

The ECC engine 234 includes a bus interface 510 that is coupled to a bus 512 (e.g., a processor bus), a memory interface block 520, and a command control block 514. The processor bus 512 includes address signals, data signals, and control and status signals (e.g., address strobes, data strobes, and an interrupt signal for notifying the processor 210 of completion of an ECC task).

The bus interface 510 provides bus access to the command control block 514 and the memory interface block 520. For example, bus interface 510 and memory interface 520 allow the processor 210 to access the shared memory 240.

The memory interface block 520 is coupled to a memory bus 522 for providing memory access to memory 240 for the other functional blocks (e.g., 530–580). The memory bus includes address signals, data signals, and control/timing signals.

The memory interface block 520 includes an arbiter 524 for arbitrating memory access between the command control block 514, the functional blocks (e.g., 530–580) and the processor 210.

The implementation and operation of the bus interface 510, the memory interface 520, and memory arbiter 524 are well-known by those of ordinary skill in the art and thus, will not be described in further detail herein.

The command control block 514 reads a ECC instruction from the shared memory 240, decodes the instruction, and configures the appropriate functional block (e.g., 530–580) of the ECC engine 234 with the configuration parameters associated with the specified ECC algorithm.

The command and control block starts execution of a current instruction. When execution is started, the functional block reads the input data from the input area 246 and writes the output data to the output area 248 by using the memory interface 520.

While a first functional block is executing, if another ECC instruction is written to a higher priority control register by the memory interface 520, the command control block 514 halts the current instruction and begins to execute the new ECC instruction. The higher priority instruction is then executed until completion unless interrupted by an instruction of an even higher priority. Upon completion of the last instruction in the sequence, the command control block 514 notifies the processor 210 of the completion and continues or resumes the halted thread. The use of multiple threads in the co-processor 230 allows a system (e.g., a wireless equipment test system) to meet real time requirements. The use of multiple threads that can correspond to real-time ECC tasks allows the system to prioritize the threads so that the threads are executed in the order of priority or importance. For example, the more urgent threads are executed ahead of the less urgent threads.

Although the functional blocks of the present invention are described with exemplary algorithms, such as convolutional encoder and CRC, it is noted that the functional blocks can be configured to implement other well-known ECC algorithms. Depending on the application and the requirements thereof, a designer can, for example, select an algorithm that provides the appropriate trade-off between ease of implementation, processing speed (e.g., MIPs), and the number of errors detected and corrected. Furthermore, a system designer can add or delete functional blocks to suit a particular application.

It is noted that in the single processor embodiment includes the configurable functional blocks (e.g., 530–580). However, elements 510, 520 and 514 may be implemented as part of the processor architecture.

Convolutional Encoder Functional Block 530

Figure 6:
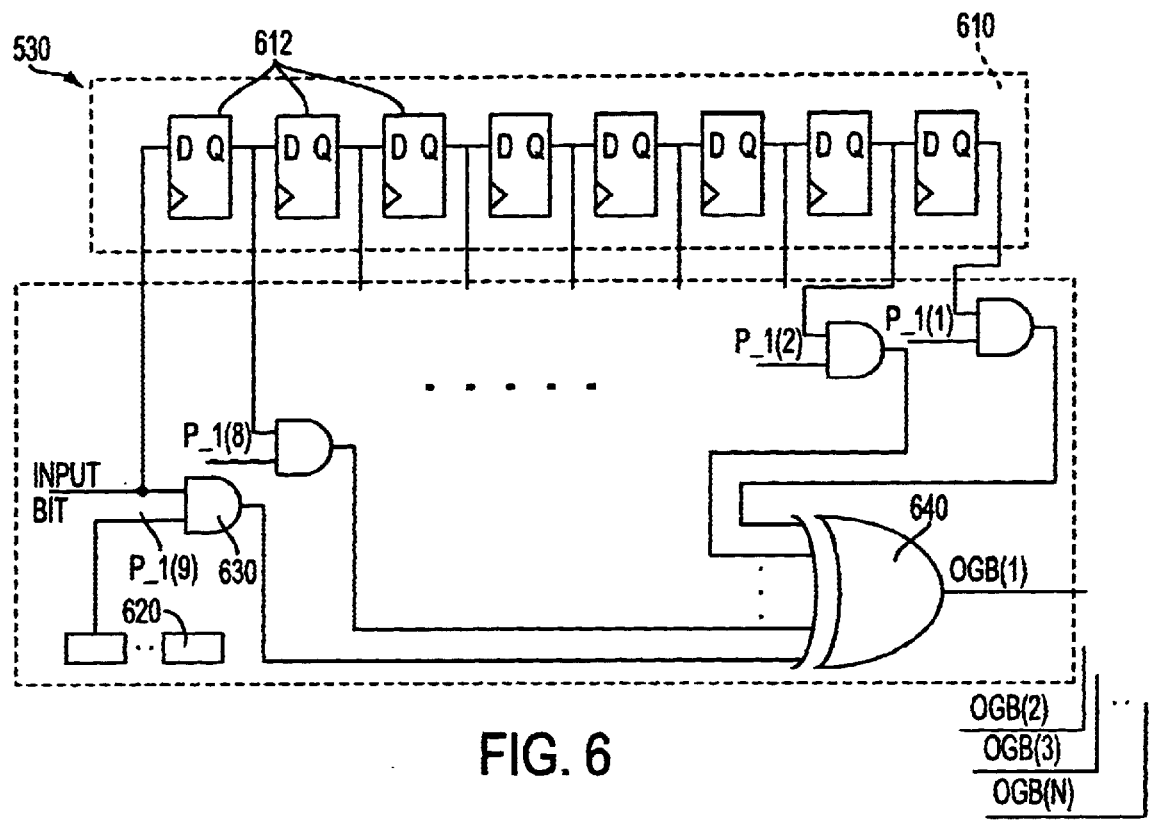
FIG. 6 is schematic diagram illustrating an exemplary implementation of the convolutional encoder module of FIG. 5.

FIG. 6 is schematic diagram illustrating an exemplary implementation of the convolutional encoder functional block 530 of FIG. 5. The convolutional encoder functional block 530 includes a plurality of output generating blocks (i.e., blocks 1 to N). It is noted that N is configurable and based on the value specified in the N field of the encoder instruction. For the sake of brevity, since each of the output generating blocks (e.g., OGB_1 to OGB_N) are configured in a similar fashion, a single output generating block (i.e., OGB_1) is described herein below.

The convolutional encoder functional block 530 further includes a shift register 610 having a plurality of memory elements 612 (e.g., D-Q flip-flops) that is coupled to each output generating block or plane.

OGB 1

Each output generating block (OGB) or plane also includes a polynomial register (e.g., register 620 for the first output generating block) for storing the coefficients of a polynomial used to generate the output bit for that output generating block. These coefficients are provided by the POLYNOMIAL fields in the encoding instruction.

Each output generating block also includes a plurality of AND gates, where each AND gate includes a first input for receiving a signal from an associated polynomial register and a second input for receiving a signal from a corresponding storage element in the shift register 620. The output of each AND gate is provided to an XOR gate (e.g., XOR gate 640 for the first output generating block). For example, a first AND gate 630 includes a first input for receiving an input bit that is also provided to the shift register 610 and a second input for receiving poly_0(8).

The output of the XOR gate 640 is an output bit of the OGB_1. It is noted that there is an output bit generator for each of the N output bits.

The coefficients of the polynomial selectively disables or masks out a bit provided from the shift register. For example, if the polynomial bit is a logical one, the AND gate allows the input bit (e.g., the output of a flip-flop of the shift register) to be presented to the XOR gate 640. Otherwise, when the polynomial bit is a logical zero, the AND gate is disabled and a logical zero is presented to the XOR gate 640, which does not affect the output of the XOR gate 640.

By utilizing this architecture for the convolutional encoder, the present invention allows a user to configure the number of output bits by specifying the number of output polynomials and also allows a user to selectively configure the number of coefficients for each polynomial and the specific coefficients related thereto. It is noted that the number of output bits and the number of coefficients per polynomial can be varied to suit a particular implementation.

CRC Functional Block 540

Figure 7:
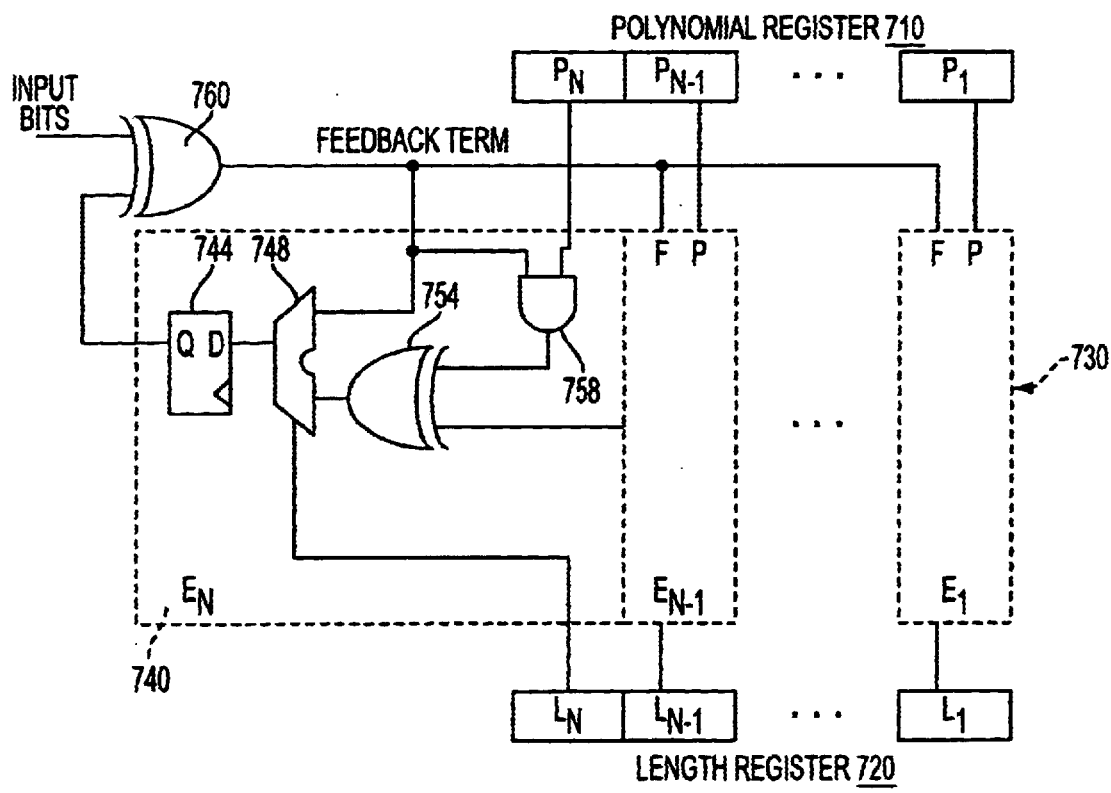
FIG. 7 is schematic diagram illustrating an exemplary implementation of the CRC module of FIG. 5.

FIG. 7 is schematic diagram illustrating an exemplary implementation of the CRC functional block 540 of FIG. 5. The CRC functional block 540 includes a polynomial register 710 for providing the coefficients of a polynomial and a length register 720 for providing a length value. The coefficients and the length value may be specified by a coefficient field and a length field, respectively, of a CRC instruction. A shift register 730 that has a plurality of storage elements (e.g., storage elements $E_N \ldots E_1$) is also provided. Each storage element includes a flip-flop, a MUX, an XOR gate, and an AND gate. For example, the Nth storage element ($E_N$) 740 includes a flip-flop 744, a MUX 748, an XOR gate 754, and an AND gate 758 configured as shown. The length value has a plurality of "0" bits and a single "1" bit for selecting a corresponding MUX (e.g., MUX 748) to select an appropriate feedback term.

The flip-flop 744 is coupled to the output of the MUX 748 for receiving one of the feedback term or the output of the XOR 754 and generates an output bit that is provided to one input of the XOR gate 760. For all the other storage elements, the output of the flip-flop is provided as the input to the XOR gate of the next storage element. The XOR gate 754 provides the XOR logical operation of the output bit of a previous storage element and the output of the AND gate 758. When the output of the AND gate 758 is a logical "1", the output bit of the previous storage element is inverted.

It is noted that the number of storage elements in the shift registers corresponds to the number of bits in the polynomial register and the number of bits in the length register.

A XOR gate 760 includes a first input for receiving the input bits and a second input for receiving the output of the last storage element ($E_N$). Based on these inputs, the XOR gate 760 generates a feedback term that is provided to the MUX and the AND gate of each storage element.

It is noted that the ECC engine of the present invention and the systems 200 and 400 described in FIGS. 2 and 4, respectively, can be implemented in a mobile unit (e.g., a cellular telephone), a base station, an RF tester for testing mobile units, and any other system or application that requires the efficient processing of ECC tasks whether such system is wireless or wired.

For example, the ECC engine of the present invention can be utilized to implement ECC algorithms in layer1 (also referred to commonly as layer1 coding or channel coding) specified by wireless communication protocols.

It is noted that the error control coding (ECC) engine of the present invention can be utilized to efficiently perform error detection and correction tasks for wireless communication applications. For example, the ECC engine of the present invention can be utilized to perform channel coding for wireless protocols, such as Advanced Mobile Phone Service (AMPS), Global System for Mobile Communications (GSM) (a European standard), IS-136 TDMA, IS-54 TDMA, and IS-95 CDMA.

Moreover, the teachings of the present invention can be extended and utilized in any application where there is a need to ensure the accuracy and integrity of data. Such applications can include, but is not limited to, other data communications systems (e.g., other wireless or wired systems), data storage systems, and other electronic digital systems. The data storage systems can include hard disk systems such as optical disk drives, magnetic disk drives, magnetic tape drives, compact disc systems, and semiconductor memories.

Furthermore, the error detection and correction (ECC) engine of the present invention can also be utilized in applications that create fault-tolerance (i.e., the provision of a mechanism by which components can fail with no loss in data or performance of the system).

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. An apparatus for performing error control processing of data comprising:
    a) a processor for executing non-error correction tasks; and
    b) a configurable error control coding (ECC) engine coupled to the processor for executing a special instruction set having at least one instruction that is tailored for error control processing.

2. The apparatus of claim 1 wherein the error control coding engine further comprises:
    a plurality of configurable functional blocks; wherein the instruction provided to the error control coding engine configures one of the functional blocks to execute an error control coding algorithm specified by the instruction.

3. The apparatus of claim 2 wherein the special instruction set includes a convolutional encode instruction, the encode instruction having
    a first field for specifying an location from which to read input data;
    a second field for specifying an location to write the output of the encode operation; and
    a third field for specifying configuration information related to the encode operation.

4. The apparatus of claim 3 wherein the configuration information includes one of a K field for specifying K input bits, an N field for specifying N output bits generated for every K input bits, and a coefficient field for specifying the coefficients for a polynomial that is associated with a convolutional encoding algorithm.

5. The apparatus of claim 2 wherein the special instruction set includes a convolutional decode instruction, the decode instruction having

- a first field for specifying a location from which to read input data;
- a second field for specifying a location to write the output of the decode operation; and
- a third field for specifying configuration information related to the decode operation.

6. The apparatus of claim 5 wherein the configuration information includes one of a K field for specifying K input bits, an N field for specifying N output bits generated for every K input bits, and a coefficient field for specifying the coefficients for a polynomial that is associated with a convolutional decode algorithm.

7. The apparatus of claim 2 wherein the special instruction set includes a cyclic redundancy code (CRC) instruction, the cyclic redundancy code (CRC) instruction having

- a first field for specifying a location from which to read input data;
- a second field for specifying a location to write the output of the CRC operation; and
- a third field for specifying configuration information related to the CRC operation.

8. The apparatus of claim 7 wherein the configuration information includes one of a length field for specifying the number of CRC bits and a coefficient field for specifying the coefficients for a polynomial that is associated with a cyclic redundancy code algorithm.

9. The apparatus of claim 2 wherein the ECC engine further comprises:

- a configurable encoding functional block for implementing a convolutional encoding algorithm.

10. The apparatus of claim 9 wherein the configurable convolutional encoder includes

- a shift register having a plurality of storage elements;
- a plurality of output bit generation blocks coupled to the shift register; wherein each output bit generation block generates a single output bit and includes
  - a plurality of first logic gates; wherein each first logic gate has a first input for receiving a coefficient of a polynomial associated with the encoding algorithm and a second input for receiving a signal from a corresponding storage element; wherein each first logic gate responsive thereto generates an output signal; and
  - a second logic gate coupled to receive the outputs of the first gates and responsive thereto for generating a single output bit.

11. The apparatus of claim 2 wherein the ECC engine further comprises:

- a configurable decoding functional block.

12. The apparatus of claim 11 wherein the configurable decoding functional block is a convolutional decoder for implementing a convolutional decoding algorithm.

13. The apparatus of claim 2 wherein the ECC engine further comprises a configurable cyclic redundancy check (CRC) functional block.

14. The apparatus of claim 2 wherein the ECC engine further comprises a bit manipulation functional block for moving sub-blocks of data in a block of data.

15. The apparatus of claim 2 wherein the ECC engine further comprises an interleave functional block for performing interleaving operations.

16. The apparatus of claim 1 further comprising:

c) a co-processor for executing error control coding tasks;
d) a shared memory coupled to the processor and the co-processor;
   wherein the configurable error control coding engine resides in the co-processor and the shared memory is utilized by the processor and the co-processor to communicate at least one specialized error correction code instruction and one block of data for processing or processed data therebetween.

17. The apparatus of claim 16 wherein after the processor passes control of a thread executing an ECC task to the co-processor, the processor can execute other threads.

18. The apparatus of claim 16 wherein the co-processor has a prioritization mechanism for allowing the processor to pass threads having different priorities to the co-processor;

wherein the co-processor determines the priority of each received thread and executes the threads based on the priority of the thread.

19. The apparatus of claim 1 further comprising:

c) a program memory for storing programs; and
d) an error control coding program stored in the program memory, said error control coding program having a plurality of instructions selected from the special instruction set; and wherein the specialized ECC instruction set is incorporated into the general instruction set utilized by the processor.

20. The apparatus of claim 19 further comprising:

a general purpose ALU for executing non-ECC related instructions; and
an instruction decoder coupled to the general purpose ALU and the ECC engine for decoding and providing non-ECC instructions to the general purpose ALU for execution and for decoding and providing ECC instructions to the ECC engine for execution.

* * * * *